United States Patent
Raby

(10) Patent No.: US 7,421,043 B2
(45) Date of Patent: Sep. 2, 2008

(54) METHOD AND/OR APPARATUS FOR STABILIZING THE FREQUENCY OF DIGITALLY SYNTHESIZED WAVEFORMS

(75) Inventor: Dean L. Raby, San Diego, CA (US)

(73) Assignee: LSI Corporation, Milpitas, CA (US)

( * ) Notice: Subject to any disclaimer, the term of this patent is extended or adjusted under 35 U.S.C. 154(b) by 1006 days.

(21) Appl. No.: 10/305,638

(22) Filed: Nov. 27, 2002

(65) Prior Publication Data

US 2004/0101069 A1    May 27, 2004

(51) Int. Cl.
*H03D 3/18* (2006.01)
*H03D 3/00* (2006.01)

(52) U.S. Cl. ............ 375/327; 375/295; 375/316; 375/324; 375/339; 329/318; 329/323

(58) Field of Classification Search ............ 375/327, 375/10, 82, 84, 96, 97, 103–104, 271, 274, 375/302, 305, 308, 304, 306, 279, 376, 373, 375/295, 316, 324, 339; 329/304, 306, 308, 329/318, 319, 322–323; 364/724.1, 724.11, 364/724.13; 455/208, 307, 164.1, 164.2; 332/101–105, 127–128, 144; 327/105, 156, 327/158

See application file for complete search history.

(56) References Cited

U.S. PATENT DOCUMENTS

| | | | | |
|---|---|---|---|---|
| 4,092,606 A | * | 5/1978 | Lovelace et al. | 329/308 |
| 4,694,327 A | * | 9/1987 | Demmer et al. | 348/508 |
| 4,736,237 A | * | 4/1988 | Fling et al. | 348/508 |
| 4,933,890 A | * | 6/1990 | Nuytkens et al. | 708/276 |
| 4,965,533 A | * | 10/1990 | Gilmore | 331/18 |
| 5,055,801 A | * | 10/1991 | Koga et al. | 331/14 |
| 5,193,103 A | * | 3/1993 | Singh et al. | 375/376 |
| 5,425,057 A | * | 6/1995 | Paff | 375/326 |
| 5,440,268 A | * | 8/1995 | Taga et al. | 329/308 |
| 5,563,535 A | * | 10/1996 | Corry et al. | 327/105 |
| 5,734,434 A | * | 3/1998 | Kettenis | 348/445 |
| 5,742,208 A | * | 4/1998 | Blazo | 331/23 |
| 5,815,541 A | * | 9/1998 | Fukushi | 375/376 |
| 5,931,891 A | * | 8/1999 | Landry | 708/271 |
| 5,952,895 A | * | 9/1999 | McCune et al. | 332/128 |
| 6,118,316 A | * | 9/2000 | Tamamura et al. | 327/156 |
| 6,191,649 B1 | * | 2/2001 | Sugita et al. | 329/304 |
| 6,240,127 B1 | * | 5/2001 | Happonen | 375/132 |
| 6,249,155 B1 | * | 6/2001 | Hartman et al. | 327/106 |
| 6,321,075 B1 | * | 11/2001 | Butterfield | 455/313 |
| 6,333,649 B1 | * | 12/2001 | Dick et al. | 327/105 |
| 6,381,265 B1 | * | 4/2002 | Hessel et al. | 375/219 |
| 6,411,658 B1 | * | 6/2002 | Sasaki | 375/326 |
| 6,650,187 B1 | * | 11/2003 | Riddle et al. | 331/17 |
| 6,697,609 B2 | * | 2/2004 | Wakamatsu et al. | 455/260 |
| 6,738,608 B2 | * | 5/2004 | Black et al. | 455/260 |
| 6,784,706 B2 | * | 8/2004 | Van Der Valk et al. | 327/147 |
| 6,825,729 B2 | * | 11/2004 | Splett | 331/16 |
| 7,095,819 B2 | * | 8/2006 | Bellaouar et al. | 375/376 |
| 2002/0150169 A1 | * | 10/2002 | Kishi | 375/295 |

* cited by examiner

*Primary Examiner*—Mohammad Ghayour
*Assistant Examiner*—Sophia Vlahos
(74) *Attorney, Agent, or Firm*—Christopher P. Maiorana, PC

(57) ABSTRACT

An apparatus comprising a first circuit, a second circuit, a third circuit and a fourth circuit. The first circuit may be configured to generate a demodulated signal in response to (i) a modulated signal and (ii) a seed value. The second circuit may be configured to generate a first control signal in response to the demodulated signal. The third circuit may be configured to generate a second control signal in response to (i) the first control signal and (ii) a compensation signal. The fourth circuit may be configured to generate the seed value in response to the second control signal.

16 Claims, 6 Drawing Sheets

US 7,421,043 B2

METHOD AND/OR APPARATUS FOR STABILIZING THE FREQUENCY OF DIGITALLY SYNTHESIZED WAVEFORMS

FIELD OF THE INVENTION

The present invention relates to frequency synthesis generally and, more particularly, to a method and/or apparatus for stabilizing the frequency of digitally synthesized waveforms.

BACKGROUND OF THE INVENTION

In a conventional Direct Digital Synthesis (DDS) approaches, a digital waveform is synthesized by accumulating a value equal to a fraction of pi every clock cycle. The value is stored in an accumulator. An output of the accumulator is translated into a digital waveform through a fixed or programmable look up table that contains the desired waveform for all values of pi. With such a conventional architecture, the frequency of a synthesized waveform depends on a programmed value equal to the desired radian change per clock cycle (i.e., DDS seed) and the clock frequency used to accumulate the DDS seed values. With conventional approaches, if either the DDS seed or the clock frequency changes, the frequency of the synthesized waveform of the output also changes. Therefore, if a system clock is phase locked to an external reference source, the stability of the DDS waveform frequency is directly proportional to the stability of the system clock.

It would be desirable to have a system to synthesize a digital waveform to maintain a constant output frequency independently of variations in the system clock frequency.

SUMMARY OF THE INVENTION

The present invention concerns an apparatus comprising a first circuit, a second circuit, a third circuit and a fourth circuit. The first circuit may be configured to generate a demodulated signal in response to (i) a modulated signal and (ii) a seed value. The second circuit may be configured to generate a first control signal in response to the demodulated signal. The third circuit may be configured to generate a second control signal in response to (i) the first control signal and (ii) a compensation signal. The fourth circuit may be configured to generate the seed value in response to the second control signal.

The objects, features and advantages of the present invention include providing a method and/or apparatus for stabilizing the frequency of digitally synthesized waveforms that may (i) allow phase lock loop clocks to produce stable carrier signals for applications such as radio frequency (RF) modulators, (ii) compensate for variations in the synthesized waveform, (iii) differentiate between frequency deviations in the quantized signal and deviations in the quantization period, (iv) compensate for the synthesized waveform in amplitude demodulation in video decoders, (v) compensate for the synthesized waveform in coherent spectral translation of intermediate frequencies (IF) down to baseband frequencies and/or (vi) generate a fixed frequency, such as a frequency modulated (FM) or amplitude modulated (AM) carrier.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
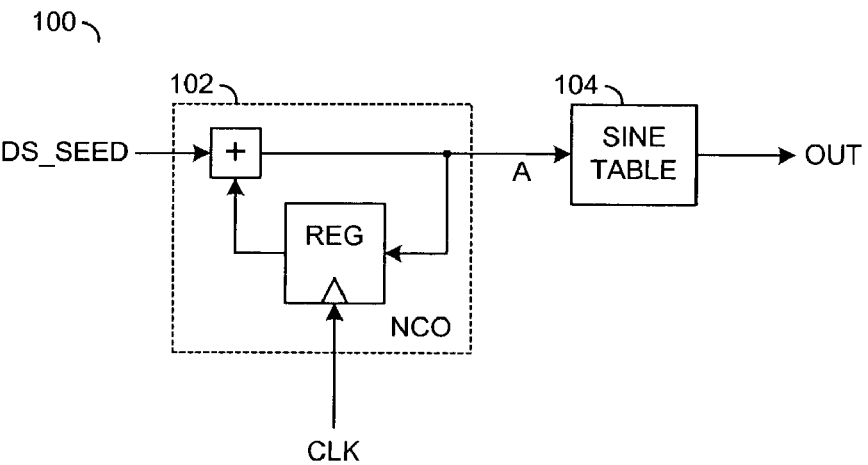
FIG. 1 is a diagram illustrating a direct digital synthesis technique.

Referring to FIG. 1, a diagram of a circuit 100 illustrating a direct digital synthesis (DDS) technique is shown. The circuit 100 generally comprises a block (or circuit) 102 and a block (or circuit) 104. The circuit 102 may present a signal (e.g., A) to the circuit 104. The signal A may be generated in response to an input signal (e.g., DDS_SEED) and a clock signal (e.g., CLK). The signal CLK may be a system clock signal oscillating at a predetermined frequency. The circuit 104 may generate a signal (e.g., OUT) in response to the signal A.

The circuit 102 generally comprises a numerically controlled oscillator (NCO). The circuit 104 generally comprises a sine table. The signal OUT may be a synthesized signal having a target frequency. The frequency of the signal OUT may depend on (i) the magnitude of the signal DDS_SEED (e.g., expressed in radians change per clock period) and (ii) the frequency of the clock signal CLK. The signal DDS_SEED may be calculated using the following formula: DDS_SEED=(desired frequency of synthesized signal/DDS clock frequency)*2^N where N is an integer equal to the number of bits used in the NCO 102.

Figure 2:
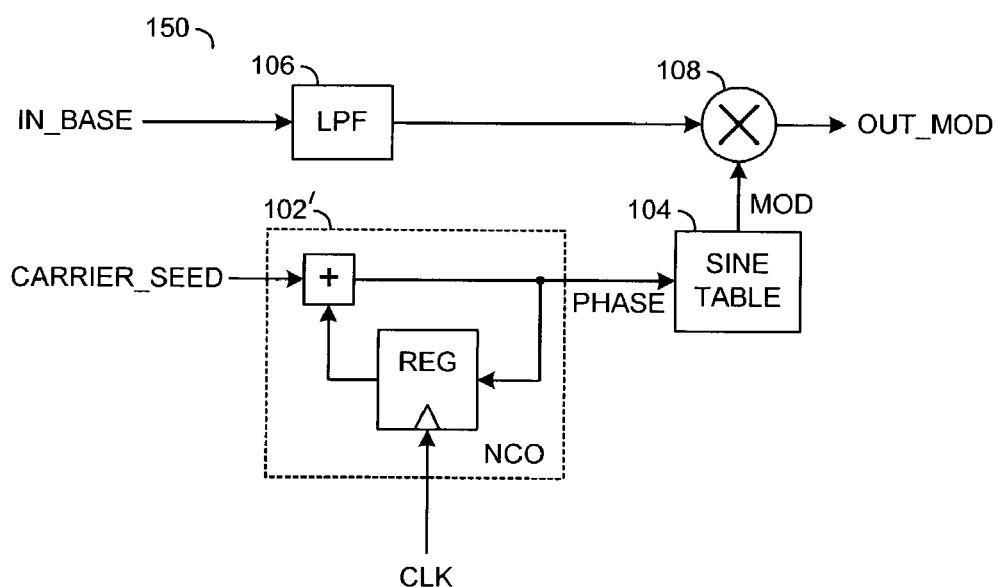
FIG. 2 is a diagram illustrating a modulation of a baseband signal using a DDS technique.

Referring to FIG. 2, a diagram of a circuit 150 illustrating a modulation of baseband signals using a DDS technique is shown. The circuit 150 generates an output signal (e.g., OUT_MOD) in response to an input signal (e.g., IN_BASE). The signal OUT_MOD may be a modulated signal. The signal IN_BASE may be a baseband signal. The circuit 150 generally comprises a circuit 102', the sine table 104, a block (or circuit) 106 and a block (or circuit) 108. The circuit 150 generates the signal OUT_MOD in response to the signal IN_BASE, a clock signal (e.g., CLK) and a signal (e.g., CARRIER_SEED). The circuit 106 may be implemented as a low pass filter (LPF) The circuit 108 may be implemented as a multiplier circuit. The circuit 108 generates the signal OUT_MOD in response to a signal MOD from the sine table 104 and the output of the circuit 106. The circuit 150 may be used to digitally modulate the signal IN_BASE received by the low pass filter 106. In one example, the low pass filter 106 changes the signal BASEBAND to a desired signal bandwidth before being modulated by the circuit 108.

Figure 3:
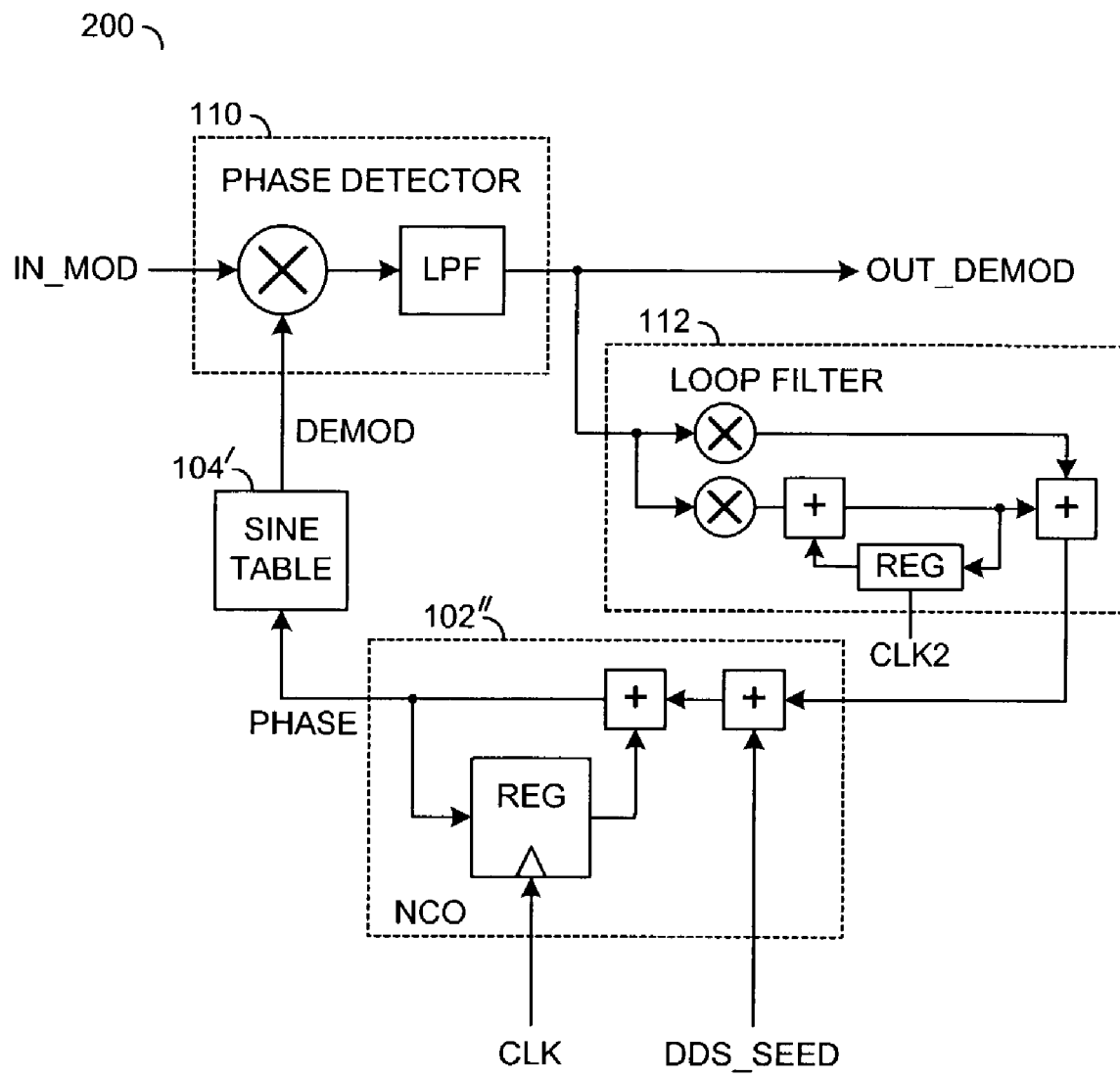
FIG. 3 is a diagram illustrating a demodulation of a modulated signal using DDS techniques.

Referring to FIG. 3, a diagram of a circuit 200 is shown illustrating the demodulation of modulated signals using a DDS technique. The circuit 200 may generate an output signal (e.g., OUT_DEMOD) in response to an input signal (e.g., IN_MOD). The signal OUT_DEMOD may be a demodulated signal. The signal IN_MOD may be a modulated signal. The circuit 200 generally comprises a circuit 102", a sine table 104', a circuit 110 and a circuit 112. The circuit 110 may be implemented as a phase detector circuit. The circuit 112 may be implemented as a loop filter circuit. The demodulated signal OUT_DEMOD may be steered by the loop filter 112. In one example, the frequency of the DDS waveform (the signal OUT_DEMOD) may be dependent on the sum of the initial signal (e.g., DDS_SEED)+/−an error signal generated by the loop filter 112. When used to generate a fixed frequency, such as a frequency modulated (FM) or amplitude modulated (AM) carrier, the circuit 200 needs the period of the signal CLK to remain stable to avoid varying the output frequency in response to variations in the frequency of input clock signal CLK.

In one example, a 10 MHz carrier (e.g., DEMOD) may be generated with the NCO 102' clocked at 100 MHz (e.g., by the clock signal CLK) using a 32-bit register phase accumulator signal (e.g., PHASE) presented to the sine table 104. One or more bits of the register may be used. The signal DDS_SEED may be: seed_10=$(10^6/100^6)*2^{32}$ or transposing, desired frequency =$(seed\_10/2^{32})*10^6$. If the frequency of the clock signal CLK changes by +1% to 101 MHz, the value of the desired frequency of the signal DEMOD may also change by 1% to 10.1 MHz. Hence, it may be difficult to modulate or demodulate a signal at a fixed carrier frequency with any sort of fidelity using a time varying clock.

Figure 4:
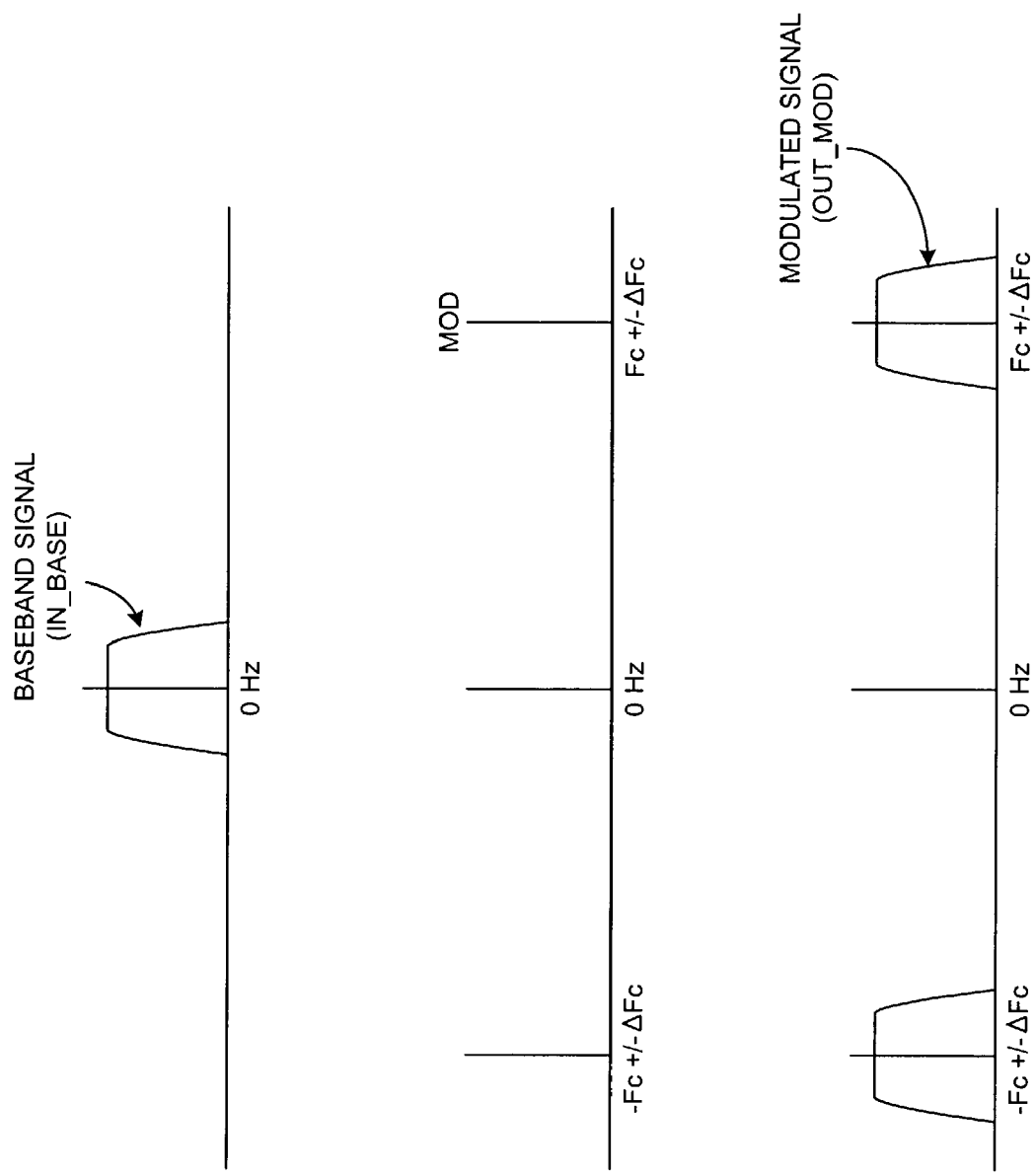
FIG. 4 is a diagram illustrating the effect on signal modulation using an uncompensated DDS design.

Referring to FIG. 4, a diagram is shown illustrating the effect on signal modulation using a DDS design. The frequency of the signal DEMOD for the modulated signal may vary depending upon the clock frequency. For applications such as digital video encoders, the variation in the frequency of the carrier may cause the color subcarrier frequency to go outside the pull-in range of the PLL within the television set. If the subcarrier frequency is outside the pull-in range, the displayed signal may be displayed in monochrome.

Figure 5:
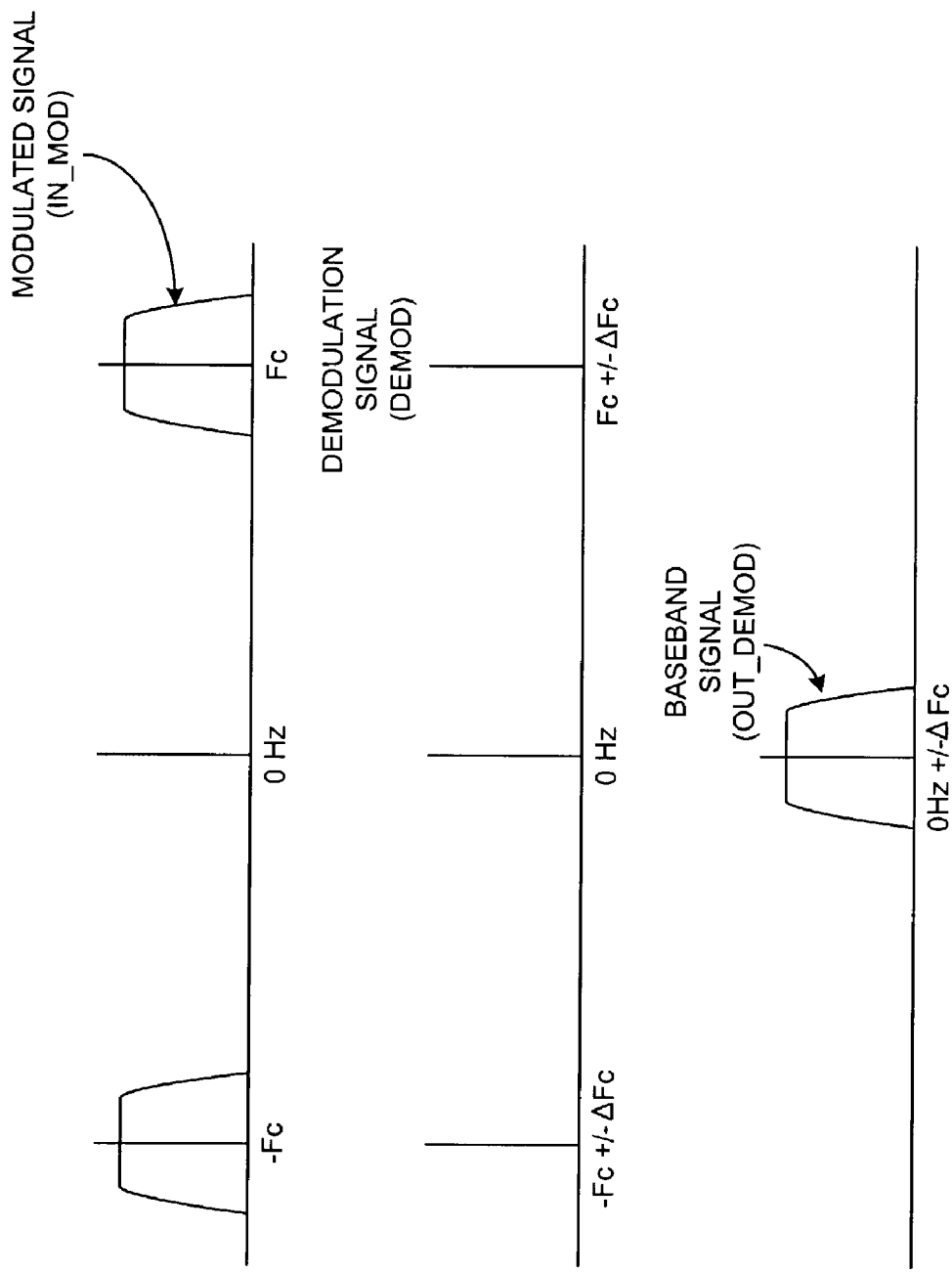
FIG. 5 is a diagram illustrating demodulation using an uncompensated DDS design.

Referring to FIG. 5, a diagram is shown illustrating demodulation using a DDS design. The modulated signal OUT_DEMOD may be at a fixed carrier frequency. In one example, the frequency of the demodulation signal generated by the DDS may vary due to changes in the DDS clock frequency. This may cause asymmetric sidebands in the demodulated baseband signal.

Figure 6:
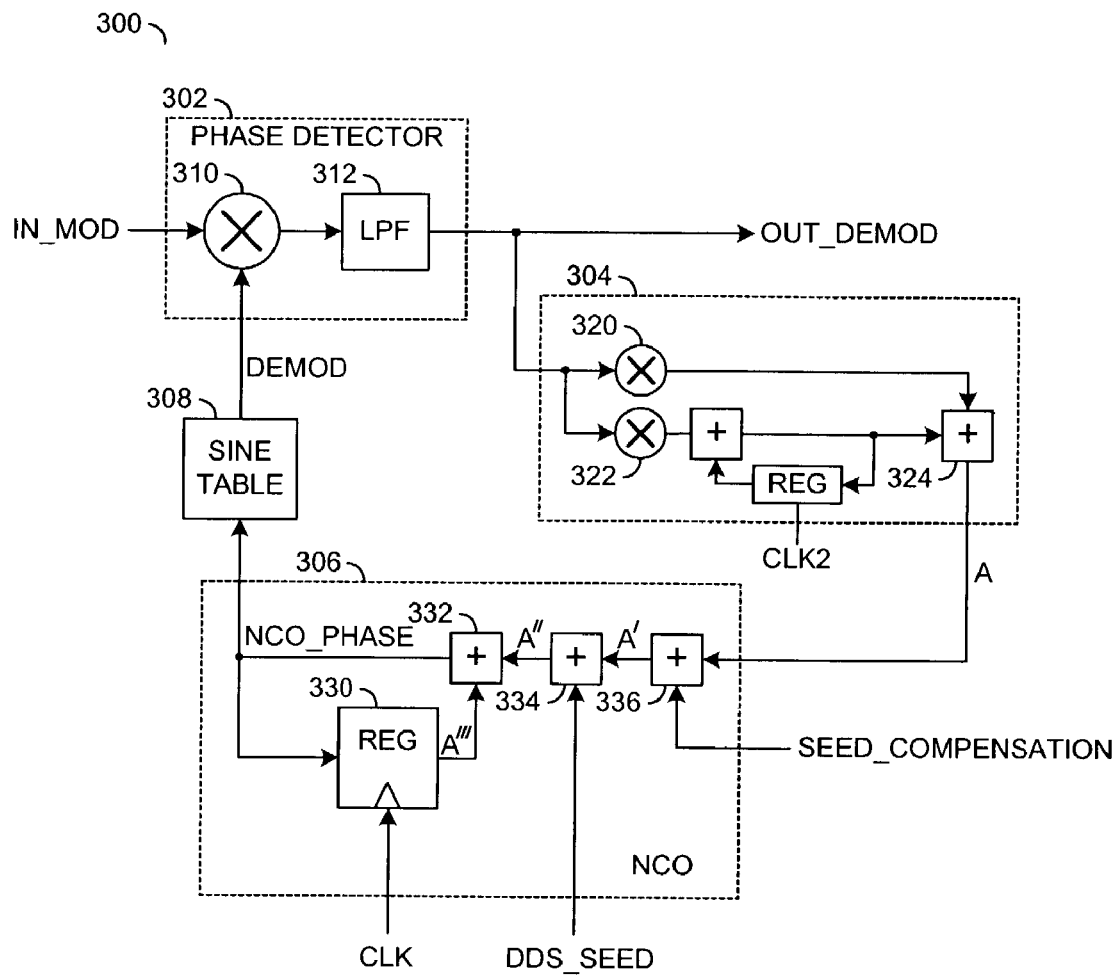
FIG. 6 is a diagram illustrating demodulation using a clock compensated DDS technique.

Referring to FIG. 6, a circuit 300 illustrating demodulation using a clock compensated DDS technique is shown. The circuit 300 may generate an output signal (e.g., OUT_DEMOD) in response to an input signal (e.g., IN_MOD). The signal OUT_DEMOD may be a demodulated signal. The signal IN_MOD may be a modulated signal. The circuit 300 generally comprises a circuit 302, a circuit 304, a circuit 306 and a circuit 308. The circuit 302 may be implemented as a phase detector. The circuit 304 may be implemented as a loop filter. The circuit 306 may be implemented as a numerically controlled oscillator (NCO) or a digitally controlled oscillator. The circuit 308 may be implemented as a sine table. To overcome the challenges presented by time varying clocks, the change in the frequency of the clock signal CLK may be used to directly scale the input to the NCO 306. The NCO 306 may then be used by the sine table 308 to maintain a stable frequency of the signal OUT_DEMOD.

The phase detector 302 generally comprises a circuit 310 and a circuit 312. The circuit 310 may be implemented as a multiplier circuit. The circuit 312 may be implemented as a low pass filter circuit. The loop filter 304 may be implemented as a multiplier circuit 320, a multiplier circuit 322 and an adder circuit 324. The NCO 306 may be implemented as a register circuit 330, an adder circuit 332, an adder circuit 334 and an adder circuit 336. However, the various components used to implement the phase detector 302, the loop filter 304 and the NCO 306 may be varied to meet the design criteria of a particular implementation. The adder circuit 336 may generate a signal (e.g., A') in response to the signal A and a compensation signal (e.g., SEED_COMPENSATION). The adder circuit 334 may generate a signal (e.g., A") in response to the signal A' and the signal DDS_SEED. The adder circuit 332 may generate a signal (e.g., NCO_PHASE) in response to the signal A" and the signal A'". The register circuit 330 generally generates the signal A'" in response to the signal CLK and the signal NCO_PHASE. The sine table 308 may generate a signal (e.g., DEMOD) in response to the signal NCO_PHASE. The signal DEMOD may be a seed value used by the phase detector 302.

The adder circuit 336 may correct the magnitude of the programmed signal DDS_SEED to compensate for changes in the frequency of the signal CLK. While a demodulator circuit has been described, a modulator circuit may be implemented in a similar manner to produce a stable carrier frequency in the presence of an unstable clock. In one example, the desired frequency may be given by: desired frequency= $((seed\_10*(100/101))/2^{32})*10^6=10^{6.}$ The frequency of a Direct Digital Synthesis (DDS) waveform may be directly proportional to the rate of change of a radian value into a lookup table 308. The frequency may be a fixed sub-multiple of the system clock signal CLK. To maintain a constant DDS output frequency when the frequency of the system clock CLK is locked to an external reference, a deviation of the clock signal CLK may be calculated and the magnitude of the signal DDS_SEED may be modified accordingly. The circuit 300 may use a Phase Lock Loop (PLL) error term to generate the signal SEED_COMPENSATION. The PLL error term may be directly proportional to the change in frequency of the signal CLK to scale the nominal value of the signal DDS_SEED. The scaled signal DDS_SEED may then be added to the original DDS seed (e.g., the signal A) so that the sum of the two seed values maintains the desired ratio of the frequency of the signal OUT_DEMOD to nominal clock frequency of the signal IN_MOD.

Figure 7:
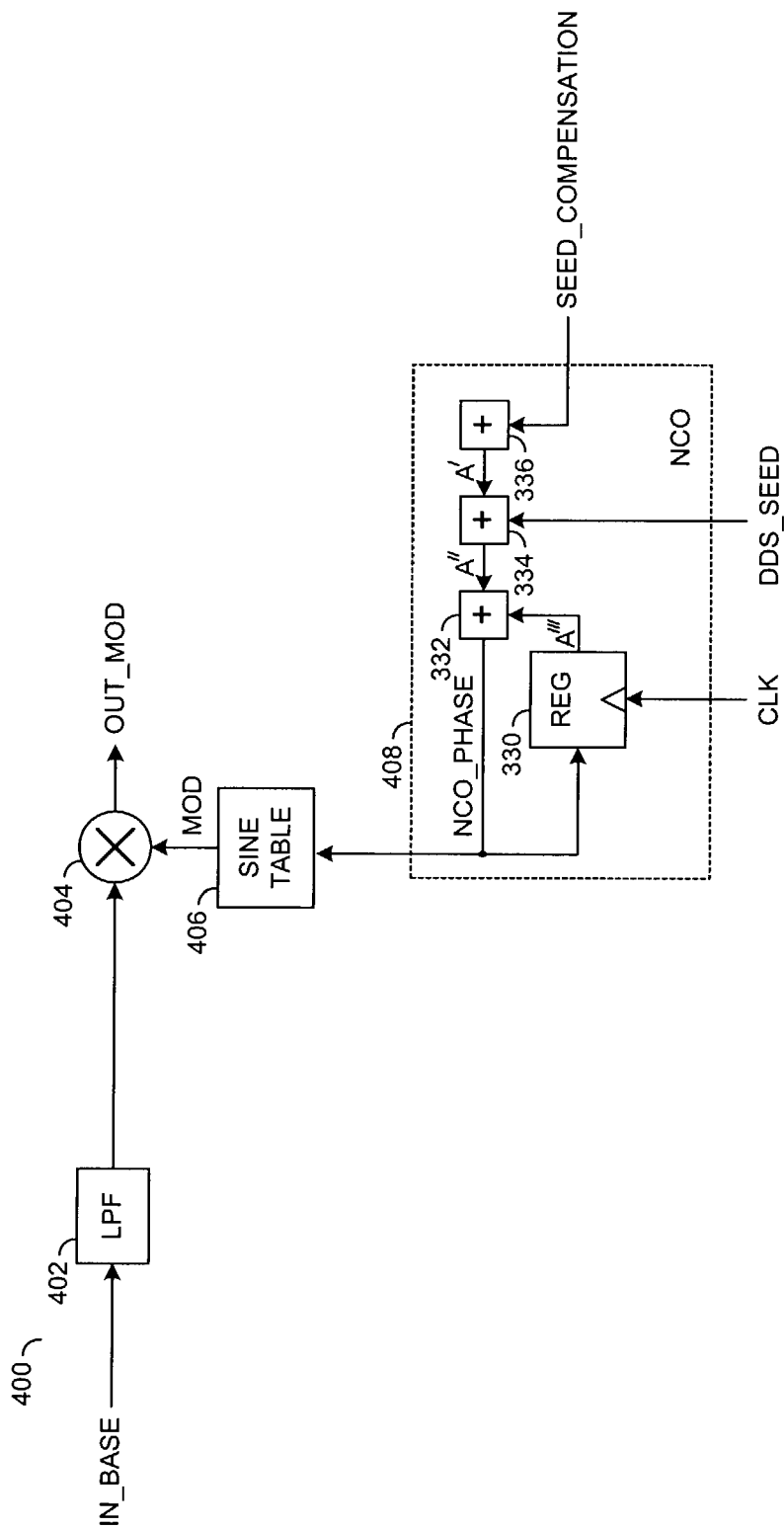
FIG. 7 is a diagram illustrating modulation of a baseband signal using a clock compensated technique.

Referring to FIG. 7, a diagram illustrating a circuit 400 illustrating a modulation of a baseband signal using a clock compensated DSS technique is shown. The circuit 400 generally comprises a circuit 402, a circuit 404, a circuit 406, and a circuit 408. The circuit 408 may be similar to the circuit 306 of FIG. 2. The signal NCO_PHASE may be used by the sine table 406 to generate the signal MOD. The circuit 404 may generate the signal OUT_MOD in response to the signal MOD and the output of the circuit 402.

In an alternate approach, for DDS applications using a fixed crystal reference, the number of cycles generated by the circuit 300 over a period of time may be measured against a system reference. The difference between the desired number of cycles and the actual number generated may be used to scale the original value DDS_SEED to compensate for errors in the external crystal frequency. If an output of an MPEG is connected to a digital composite video encoder (DENC), the clock variation due to Program Clock Recovery (PCR) may generate a chrominance subcarrier which deviates more than +/−100 Hz away from nominal. Such a deviation may cause some picture monitors to lose color lock. The degree of clock variation may be calculated directly from the PCR recovery logic, and in a similar way to a PLL, could be used to directly scale the chrominance subcarrier SEED programmed into a DENC.

While the invention has been particularly shown and described with reference to the preferred embodiments thereof, it will be understood by those skilled in the art that various changes in form and details may be made without departing from the spirit and scope of the invention.

The invention claimed is:

1. An apparatus comprising:
a first circuit configured to generate a demodulated signal in response to (i) a modulated signal and (ii) a seed value, wherein said first circuit comprises a phase detector circuit;
a second circuit configured to generate a first control signal in response to said demodulated signal;
a third circuit configured to generate a second control signal in response to (i) said first control signal and (ii) a compensation signal, wherein (a) said third circuit generates said second control signal by adding said first control signal to said compensation signal and (b) said third circuit further comprises a register configured to clock said second control signal to a clock signal; and
a fourth circuit configured to generate said seed value in response to said second control signal, wherein said apparatus uses said compensation signal to maintain a constant frequency of said demodulated signal independently of variations in the frequency of the clock signal.

2. The apparatus according to claim 1, wherein said third circuit comprises a compensation circuit.

3. The apparatus according to claim 1, wherein said fourth circuit comprises a sine table.

4. The apparatus according to claim 1, wherein said third circuit generates said second control signal in further response to a carrier signal.

5. The apparatus according to claim 1, wherein said compensation signal is generated in response to variations in a reference clock signal.

6. The apparatus according to claim 1, wherein said second circuit comprises a loop filter circuit.

7. The apparatus according to claim 1, wherein said clock signal comprises an external clock signal.

8. An apparatus comprising:
a first circuit configured to generate a modulated signal in response to (i) a filtered signal and (ii) a modulation control signal;
a second circuit configured to generate said modulation control signal in response to a phase signal; and
a third circuit configured to generate said phase signal in response to (i) a clock signal, (ii) a carrier seed signal, and (iii) a seed compensation signal, wherein (a) said third circuit generates said phase signal by adding said seed carrier signal to said seed compensation signal and (b) said third circuit further comprises a register configured to clock said phase signal to a clock signal, wherein said apparatus uses said compensation signal to maintain a constant frequency of said modulated signal independently of variations in the frequency of the clock signal.

9. The apparatus according to claim 8, wherein said filtered signal is generated using a low pass filter circuit.

10. The apparatus according to claim 8, wherein said second circuit comprises a sine table.

11. The apparatus according to claim 8, wherein said filtered signal comprises a baseband signal.

12. The apparatus according to claim 8, wherein said clock signal comprises an external clock signal.

13. A method for generating a demodulated signal comprising the steps of:
(A) generating a demodulated signal in response to (i) a modulated signal and (ii) a seed value, wherein said demodulated signal is generated using a phase detector circuit;
(B) generating a first control signal, using a loop filter, in response to said demodulated signal;
(C) generating a second control signal in response to (i) said first control signal and (ii) a compensation signal, wherein said second control signal is generated by adding the first control signal to the compensation signal and said second control signal is clocked by a register to a clock signal; and
(D) generating said seed value in response to said second control signal, wherein said compensation signal is used to maintain a constant frequency of said demodulated signal independently of variations in the frequency of the clock signal.

14. The method according to claim 13, wherein said second control signal is generated using a compensation circuit.

15. The method according to claim 13, wherein said seed value is generated using a sine table.

16. The method according to claim 13, wherein said clock signal comprises an external clock signal.

* * * * *